United States Patent
Takebayashi et al.

[11] Patent Number: 5,957,651
[45] Date of Patent: Sep. 28, 1999

[54] SUBSTRATE CARRYING APPARATUS

[75] Inventors: Yuji Takebayashi; Tokunobu Akao; Yoshikazu Konno, all of Tokyo, Japan

[73] Assignee: Kokusai Electric Co., Ltd., Tokyo, Japan

[21] Appl. No.: 08/776,653
[22] PCT Filed: Jun. 6, 1996
[86] PCT No.: PCT/JP96/01531
  § 371 Date: Jul. 21, 1997
  § 102(e) Date: Jul. 21, 1997
[87] PCT Pub. No.: WO96/42108
  PCT Pub. Date: Dec. 27, 1996

[30] Foreign Application Priority Data

Jun. 8, 1995  [JP]  Japan .................................. 7-142128

[51] Int. Cl.⁶ .................................................. B65G 49/07
[52] U.S. Cl. .................................. 414/744.5; 414/744.3; 414/936; 414/940; 414/941
[58] Field of Search .................... 414/936, 940, 414/941, 744.3, 744.5

[56] References Cited

U.S. PATENT DOCUMENTS

| 4,655,584 | 4/1987 | Tanaka et al. | 414/936 |
| 4,685,206 | 8/1987 | Kobayashi et al. | 414/936 |
| 4,887,904 | 12/1989 | Nakazato et al. | 414/936 |
| 4,944,650 | 7/1990 | Matsumoto | 414/941 |
| 5,133,635 | 7/1992 | Malin et al. | 414/941 |
| 5,421,889 | 6/1995 | Pollock et al. | 414/940 |
| 5,484,252 | 1/1996 | Mutoh | 414/941 |
| 5,558,482 | 9/1996 | Hiroki et al. | 414/941 |
| 5,566,466 | 10/1996 | Hearne | 414/936 |
| 5,700,046 | 12/1997 | Van Doren et al. | 414/941 |
| 5,700,127 | 12/1997 | Harada et al. | 414/940 |
| 5,711,646 | 1/1998 | Ueda et al. | 414/941 |

FOREIGN PATENT DOCUMENTS

| 3-46251 | 2/1991 | Japan . | |
| 4-65149 | 3/1992 | Japan . | |
| 5-55342 | 3/1993 | Japan | 414/941 |
| 5-182891 | 7/1993 | Japan . | |
| 5-243366 | 9/1993 | Japan . | |

OTHER PUBLICATIONS

An English Language Abstract of JP 4–65149.
An English Language Abstract of JP 3–46251.
An English Language Abstract of JP 5–182891.
An English Language Abstract of JP 5–243366.
An International Search Report.

*Primary Examiner*—David A. Bucci
*Assistant Examiner*—Douglas Hess
*Attorney, Agent, or Firm*—Greenblum & Bernstein, P.L.C.

[57] ABSTRACT

A rotary shaft is supported by a frame so as to be rotatable and movable vertically relative to the frame. A carrying arm is pivoted to the rotary shaft and a substrate receiver is attached to an end of the carrying arm and receives a substrate. A guide base is mounted on the rotary shaft on the lower side of the substrate receiver in such a manner that the guide base is approximately parallel to the substrate receiver, and a substrate alignment mechanism is attached to the rotary shaft via the guide base. The substrate alignment mechanism includes a pair of location correcting members which are coupled to air cylinders. The location correcting members are displaced by air cylinders to correct the location of substrate.

22 Claims, 10 Drawing Sheets

SUBSTRATE CARRYING APPARATUS

BACKGROUND OF THE INVENTION

1. Field of the Invention

The present invention relates to a substrate carrying apparatus for carrying processed substrates, particularly to a substrate carrying apparatus in which locating of the carried substrates is possible.

2. Description of the Background Information

A known substrate carrying apparatus is described in Japanese Laid-Open Patent Publication (Kokai) No. HEI 4-65149 (1992). The substrate carrying apparatus disclosed in the above-mentioned publication comprises a carrying arm including a plurality of pivot joints, a substrate receiver provided on a head of the carrying arm, and a substrate engaging portion provided at a head of the substrate receiver. Further, a locating member is provided above the substrate receiver extending in the direction of the width of substrate receiver, and is supported via the substrate receiver by a connecting portion, in such a manner that the locating member can move forward or backward by the revolution of the substrate receiver. As for the X-axis direction of substrate, the locating member advances in such a manner that the substrate is inserted between the locating member and the substrate engaging portion, by which the locating of substrate is made. As for Y-axis direction of the substrate, the substrate is inserted between pushing plates provided at both ends of the locating member, by which the location of the substrate is accomplished.

In recent years, processed substrates are becoming larger. This is due to the productivity increase in the production of semiconductors, or to the increased demand for large-sized liquid crystal display substrates for LCD liquid displays. Manufacturing larger substrates means that the substrate itself becomes heavier, and the load applied on the carrying arm becomes higher.

However, in the apparatus disclosed in the above-mentioned publication, since the locating member is supported by the substrate receiver via the connecting portion, the weight of the substrate receiver is applied on the carrying arm, and the carrying arm is thereby bent. Accordingly, there is a fear that the carrying of the substrate is hindered. Furthermore, the load of the carrying arm applied to the driving means for driving the carrying arm is increased.

Additionally, in the case of locating substrates, it is desirable to reduce the contacting area with the substrate to as little as possible in order to prevent contamination of the substrate. However, in the above-mentioned conventional example, each of the members for locating the substrate relative to the X-axis, the members for locating the substrate relative to the Y-axis, and the substrate-receiving part, are brought into contact with the substrate. Accordingly, the total contacting area becomes larger.

Still further, since the shape of the substrate receiver itself conforms to the shape of the substrate, the larger a substrate becomes, the larger the substrate receiver becomes. Therefore, bending of substrate receiver is caused even by empty weight, by which the head of the substrate is bent, and so there is a fear that carrying of the substrate is hindered.

SUMMARY OF THE INVENTION

It is an object of the present invention to provide a substrate carrying apparatus in which locating of the substrate can be made without additional load being applied on a carrying arm.

It is a further object of the present invention to provide a substrate carrying apparatus in which the area in contact with substrate is made as small as possible, so that locating of substrate can be made while contamination of substrate is reduced to a minimum.

It is a still further object of the present invention to provide a substrate carrying apparatus in which the load applied on a carrying arm can be reduced by making a substrate receiver light-weight.

To achieve the above-mentioned object, a substrate carrying apparatus according to the present invention comprises a frame, a rotary shaft mounted on frame so as to be rotatable and movable vertically relative to the frame, a carrying arm pivoted to the rotary shaft, a substrate receiver attached to an end of the carrying arm to receive a substrate alignment mechanism means for locating the substrate on the substrate receiver; said substrate alignment mechanism means being attached to the rotary shaft via a guide base.

Locating of the substrate is performed by the substrate alignment mechanisms attached to the rotary shaft via a guide base. The load of the substrate alignment mechanisms is applied on the guide base, but not applied on the carrying arm.

Since the guide base is rotated together with the rotary shaft, the substrate alignment mechanisms can hold the substrate during rotation of the rotary shaft. Therefore, shifting of the substrate from the proper location is not caused, even if the rotary shaft rotates at high speed. Accordingly, the substrate carrying can be performed accurately at high speed.

In another aspect of a substrate carrying apparatus according to the present invention, the substrate alignment mechanism may include at least a pair of location correcting members coupled to driving means, and disposed opposing each other with the substrate between the pair of location correcting members, and each locating correction member is displaced by the driving means so that it can be brought into contact with the substrate. Alternatively, the substrate alignment mechanism may include at least a pair of location correcting members, first of which is fixed to the guide base and a second of which is coupled to driving means, the location correcting members being disposed opposing each other with the substrate between them, and the second of the location correcting members being displaced by the driving means so that each locating correction member can be brought into contact with the substrate.

According to the still another aspect of the invention, the substrate carrying apparatus comprises a frame; a rotary shaft supported by the frame so as to be rotatable and movable vertically relative to the frame; a carrying arm pivoted to the rotary shaft; a substrate receiver attached to an end of the carrying arm, wherein a substrate is put on the substrate receiver. The substrate carrying apparatus further comprises a guide base which is fixed to the rotary shaft in such a manner that the guide base is approximately parallel to the substrate receiver below the substrate receiver; driving means supported by the guide base; and location correcting members extending above the substrate receiver and coupled to the driving means, wherein the location correcting members are displaced by the driving means so that the substrate is held in place.

Since loads of the driving means and the location correcting members are applied on the rotary shaft via the guide base, the carrying arms can be freed from the loads.

Further, the location correcting members may be disposed on a diagonal line of the rectangular substrate.

Still further, each location correcting member is preferably constructed so that it can be brought into contact with adjacent sides of the substrate at a corresponding corner of the rectangular substrate.

Since locating of the substrate relative to both the X-axis and Y-axis directions can be made by the location correcting members at diagonally opposed corners of the substrate, the construction for locating of the substrate can be simplified.

Preferably, each location correcting member has a contact portion which has a circular profile or an ellipse profile from a plan view. The contacting area of the substrate carrying apparatus with substrate can be thereby minimized.

Further, in the substrate carrying apparatus according to the present invention, the substrate receiver can have a base portion which is attached to the carrying arm, a plurality of pawl portions which diverge from the base portion and each individual pawl portion extending toward a head, wherein the width of each individual pawl portion tapers down toward the head.

By providing a plurality of pawl portions having a width which tapers down toward the head of each individual pawl portion, the strength of the frame area of the substrate receiver can be preserved, while any moment of rotation applied on the pawl portion due to the empty weight of the pawl portion is made smaller such that bending of the substrate receiver can be prevented.

Further, the thickness of each individual pawl portion may be thinner toward the head. The weight of the head of each pawl portion can be reduced by adjusting the thickness of the pawl portions.

Still further, the substrate receiver may have a bridge portion connecting the pawl portions with each other at the appropriate positions of the pawl portions. Reinforcement can be made by connecting the individual pawl portions with each other through the bridge portion and simultaneously, the load applied on individual pawl portion can be equalized such that the substrate receiver can be prevented for inclining.

DETAILED DESCRIPTION OF THE PREFERRED EMBODIMENTS

Figure 1:
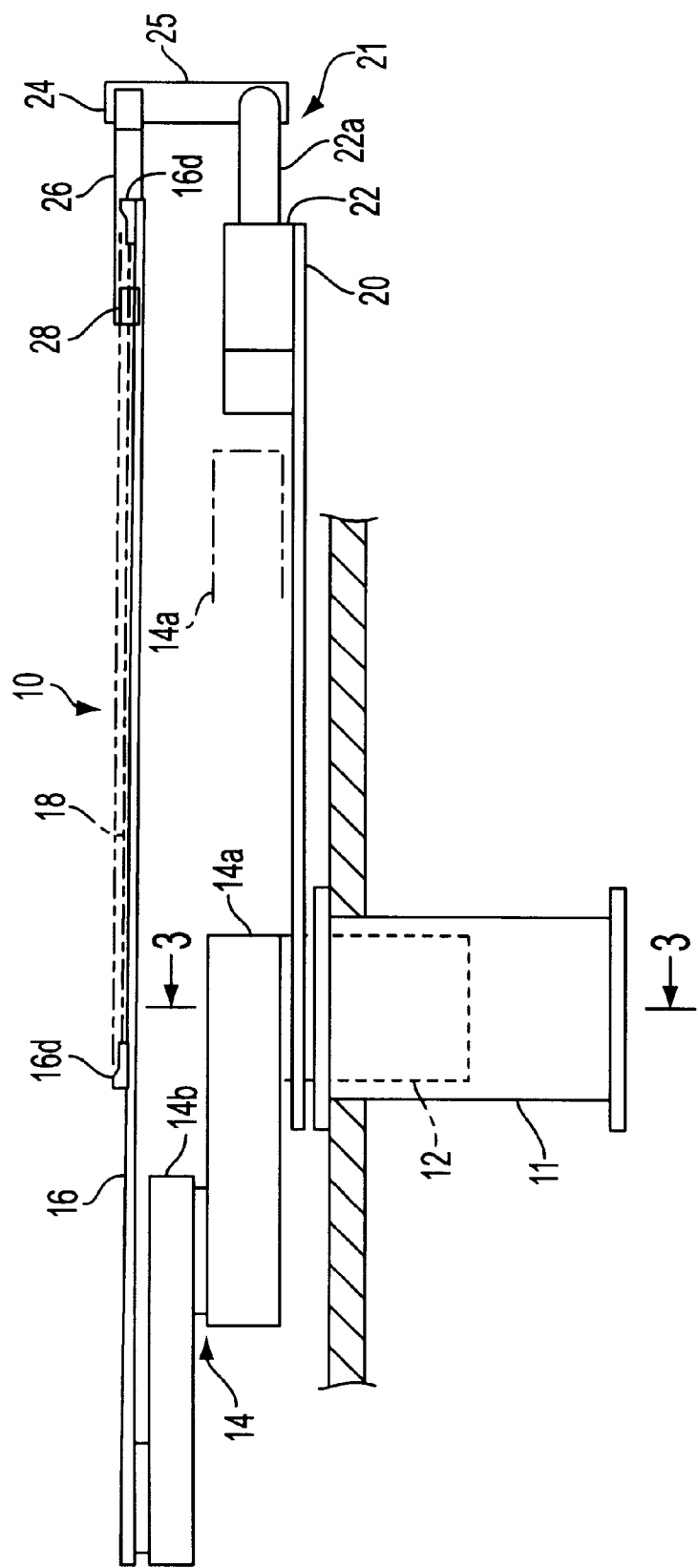
FIG. 1 is a sectional side elevation of an embodiment of a substrate carrying apparatus according to the present invention.
Figure 2:
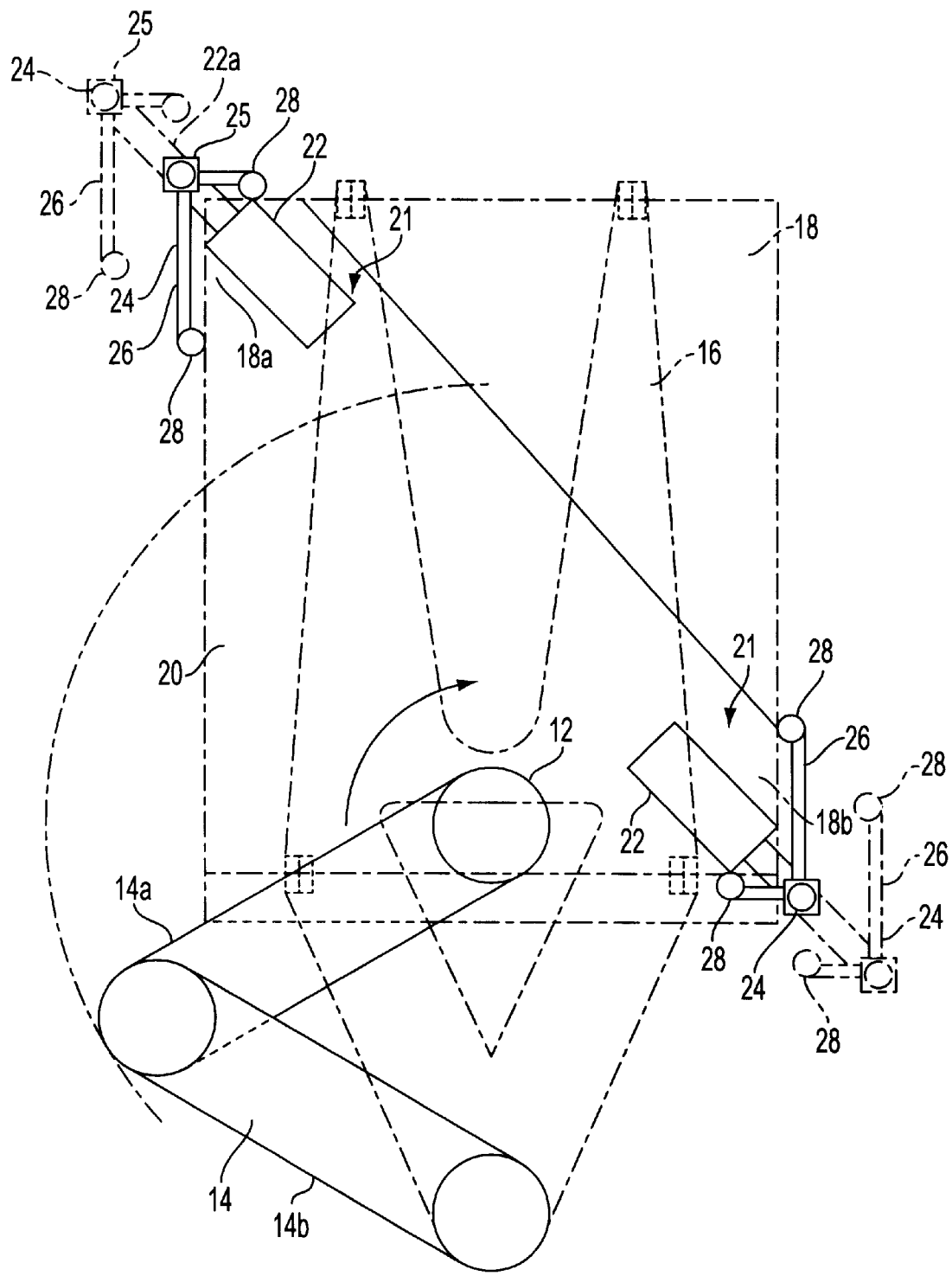
FIG. 2 is a plan view of the apparatus shown in FIG. 1.

FIG. 1 is a sectional side elevation of first embodiment of a substrate carrying apparatus according to the present invention, and FIG. 2 is a plan view of the apparatus shown in FIG. 1.

Referring to FIG. 1, a substrate carrying apparatus 10 comprises a frame 11. A rotary shaft 12 is supported by the frame 11 so as to be rotatable and movable vertically relative to the frame 11. A carrying arm 14 is pivoted rotatably to a top end of the rotary shaft 12. The carrying arm 14 comprises a plurality of articulated arms 14a, 14b. One of the articulated arms 14a, 14b is bent or contracted, extended relative to other articulated arm, so that the whole of the carrying arm 14 can be extended or contracted. A substrate receiver 16 is attached to an end of the carrying arm 14. A substrate 18 is placed on the substrate receiver 16, and carried.

Figure 3:
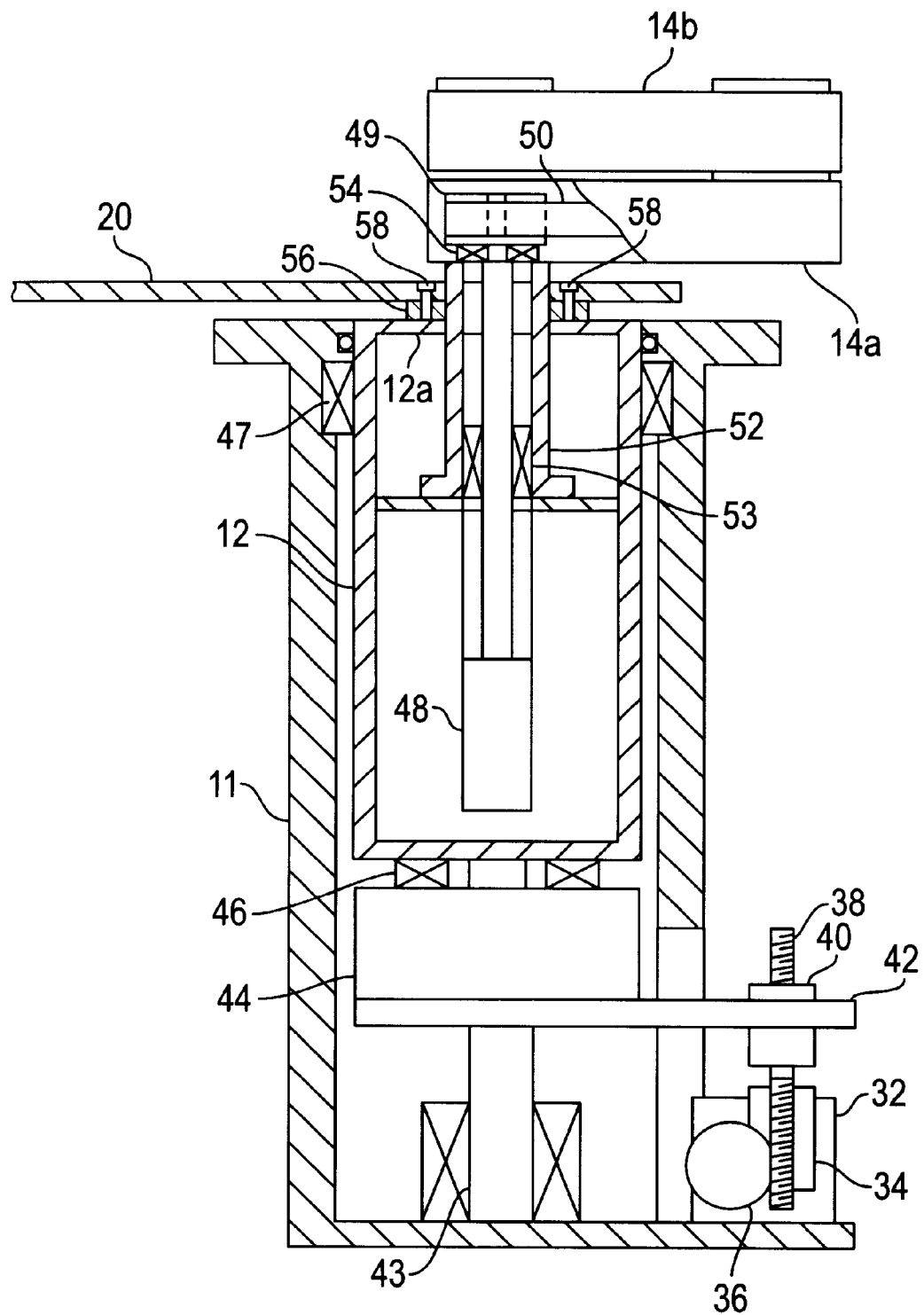
FIG. 3 is a sectional view taken on line 3—3 of FIG. 1.

FIG. 3 is a detailed sectional view showing a portion of the substrate carrying apparatus 10, including frame 11, rotary shaft 12 and carrying arm 14. A motor 32 for vertical travel of the rotary shaft 12 and the carrying arm 14 is mounted on the bottom of frame 11, so that a screw 38 can be rotated by the rotation of motor 32 as transmitted through gears 34 and 36 to the screw 38. Accordingly, the rotation of the screw 38 makes a bush 40 threadably engaged with the screw 38 move vertically. A table 42 secured to the bush 40 is moved vertically relative to the frame 11, together with the bush 40. The table 42 is guided by a guide shaft 43 secured to the frame 11. A motor 44 for rotation of rotary shaft is mounted on the table 42. The rotary shaft 12 is mounted on the motor 44 for rotation of the rotary shaft 12 through a guide 46. The driving shaft of the motor 44 is connected with the rotary shaft 12 so that the rotary shaft 12 can be rotated relative to the frame 11 by the rotation of the motor 44 for rotating the rotary shaft 12. In FIG. 3, a guide 47 supports the rotary shaft 12 against frame 11 in such a manner that the rotary shaft 12 is rotatable and movable vertically relative to the frame 11. By the above-mentioned construction, the rotary shaft 12 is mounted to the frame 11 to be rotatable and movable vertically relative to the frame 11.

The rotary shaft 12 incorporates thereinside a motor 48 for rotation of the arm. The driving shaft of the motor 48 for rotation of the arm is connected with a pulley 49, which is mounted inside the articulated arm 14a of the carrying arm 14. The driving shaft of the motor 48 connects to the pulley 49 through a tubular body 52 having a lower end secured to the rotary shaft 12 and a top end that supports the carrying arm 14. Guides 53, 54 rotatably support the driving shaft of the motor 48. A timing belt 50 is wound on the pulley 49. Further, the timing belt 50 is wound on another pulley (not shown) which is mounted at the other end of the articulated arm 14a in such a manner that the articulated arm 14b can be rotated. Still further, another timing belt (not shown) is provided in the articulated arm 14b so that the substrate receiver 16 can be rotated. Accordingly, the drive of motor 48 for rotation of the arm makes the articulated arm 14a, the articulated arm 14b, and the substrate receiver 16 rotate so that the whole of carrying arm 14 is extended or contracted.

A guide base 20 is secured to the rotary shaft 12 in a lower position than the carrying arm 14. Namely, a spacer 56 is interposed between the rotary shaft 12 and the guide base 20. The guide base 20 is secured to the rotary shaft 12 with a plurality of screws 58, 58. The screws 58, 58 do not penetrate the lid plate portion 12*a* of the rotary shaft 12 to maintain sealing of the cavity in the rotary shaft 12. The guide base 20 is positioned below the substrate receiver 16 in such a manner that the guide base 20 is approximately parallel to the substrate receiver 16.

A substrate alignment mechanism 21 is attached to the rotary shaft 12 via the guide base 20 in order to align the substrate 18 to be placed on the substrate receiver 16. As shown in FIG. 2, the guide base 20 is substantially shaped as a rectangle with a corner cut off, in such a manner that the guide base 20 connected the substrate alignment mechanism 21 with the rotary shaft 12. Preferably, in order that the guide base 20 is prevented from bending under the weight of a pair of air cylinders 22, 22 and the substrate alignment mechanism 24, the thickness of the guide base 20 may be appropriately selected, or the area of the guide base 20 may be widened, or other countermeasures may be considered. Further, the guide base 20 May be constructed as a plurality of parts rather than only one part.

The substrate alignment mechanism 21 includes a pair of location correcting members 24 which are coupled to the piston rods 22*a*, 22*a* of the pair of air cylinders 22, 22 (a driving means), respectively. The two air cylinders 22, 22 are mounted on the guide base 20.

However, the air cylinders (driving means) 22, 22 are not limited to mounting on the upper surface of the guide base 20 as shown, but can be alternatively secured to the lower surface of the guide base 20 by screws (a fixing means). Furthermore, motors, linear solenoids or others can be substituted for air cylinders 22 as a driving means.

Two location correcting members 24 are disposed on a diagonal line of the rectangular substrate 18 to be placed on the substrate receiver 16, with the substrate 18 between them, and corresponding to diagonally opposed corners 18*a*, 18*b* of the rectangular substrate 18.

Each individual locating/alignment mechanism 24 comprises an arm 25 extending perpendicularly relative to the corresponding piston rod 22*a*, a holder 26 having an L-shaped profile (from a plan view) secured to a top end of the arm 25, and the contact portions 28 secured to both ends of the holder 26. The contact portions 28 can be brought into contact with a substrate 18. Each L-shaped holder 26 has two sides, parallel to the adjacent sides of the substrate 18 near the corners 18*a*, 18*b* of a located substrate 18.

Figure 13:
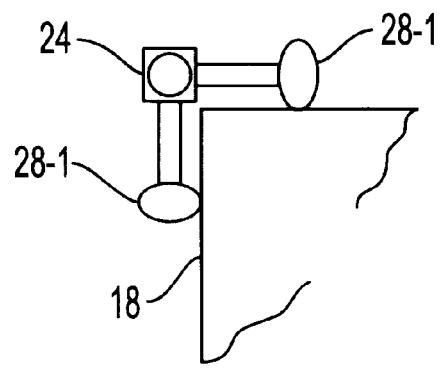
FIG. 13 is a plan view of a portion of the second version of a substrate carrying apparatus according to the present invention.

The material of the contact portion 28 can be selected from materials having a lower influence of contamination on the substrate, such as Teflon, polyimide or the like. Furthermore, each contact portion 28 has a circular profile (from a plan view) and a columnar shape in three dimensions so that each contact portion 28 comes in line contact with the substrate 18. Alternatively, each contact portion 28 has a spherical shape to come in point contact with the substrate 18. Consequently, the contacting area with the substrate 18 can be reduced. However, the shape of contact portion 28 is not restricted to a circular profile (from a plan view), but may be noncircular. For example, the shape of the contact portion 28 may be an ellipse profile (from a plan view), as shown by contact portion 28-1 in FIG. 13. Although the shape of the contact portion 28 may be a circular profile or an elliptical profile (from a plan view) in order to prevent abrasion, since the contact portion 28 can be brought into contact with the substrate 18 at a curved surface of the contact portion 28, a shape of contact portion 28 can alternatively be a polygon having three or more corners. In either case, the area of contact should be controlled to be smaller. Furthermore, although in the example shown in FIG. 2 one contact portion 28 is brought into contact with each side of the substrate 18, more than two contact portions can be provided to touch against each side of the substrate 18.

Figure 4:
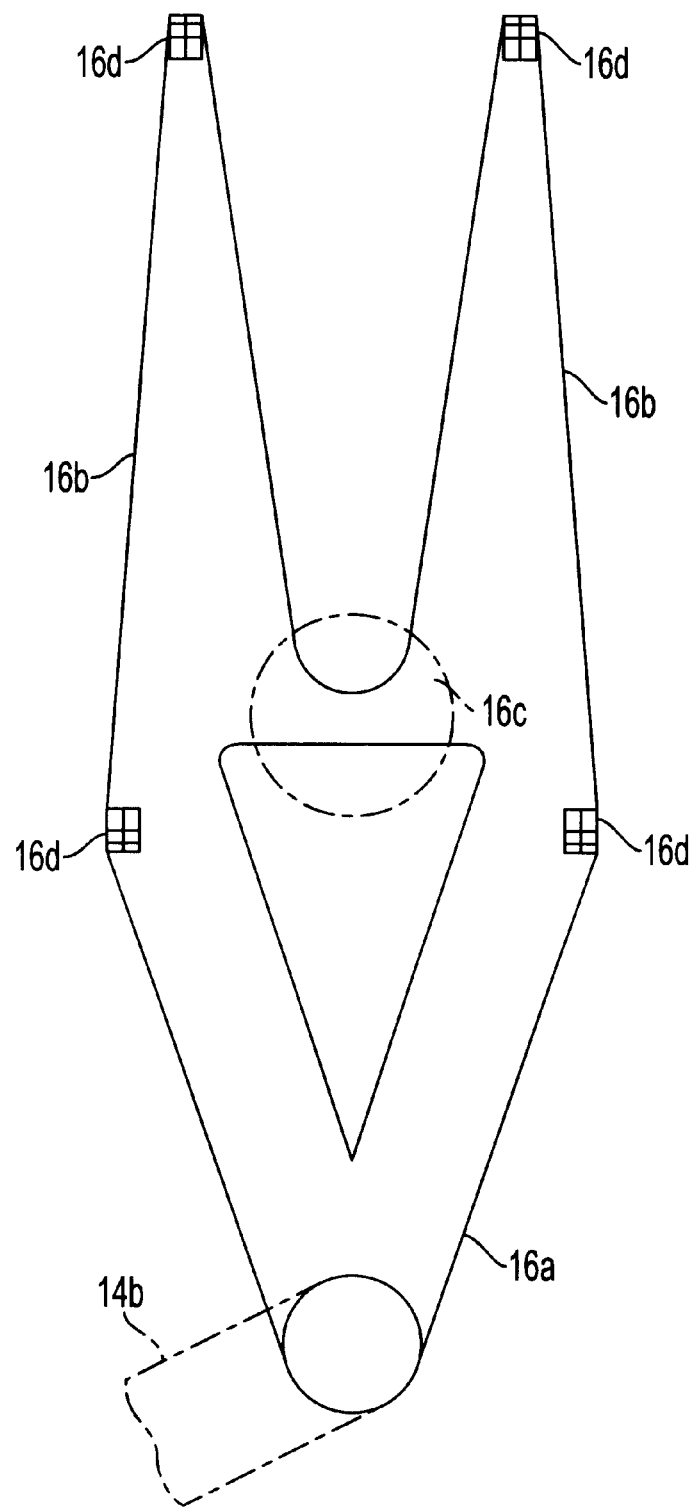
FIG. 4 is a plan view of a substrate receiver used in FIG. 1.
Figure 5A:
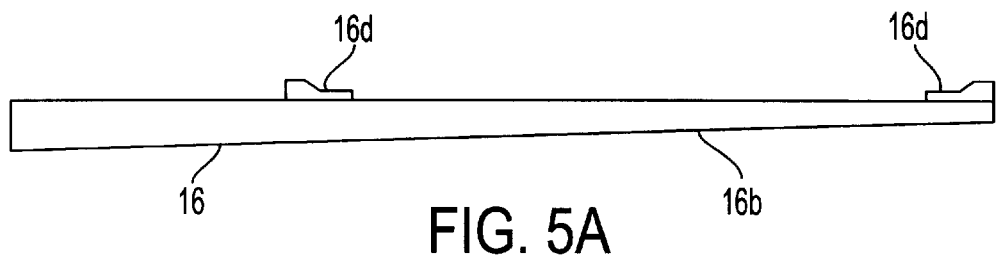
FIGS. 5 (a), (b), (c) are side views of substrate receivers, respectively.
Figure 5B:
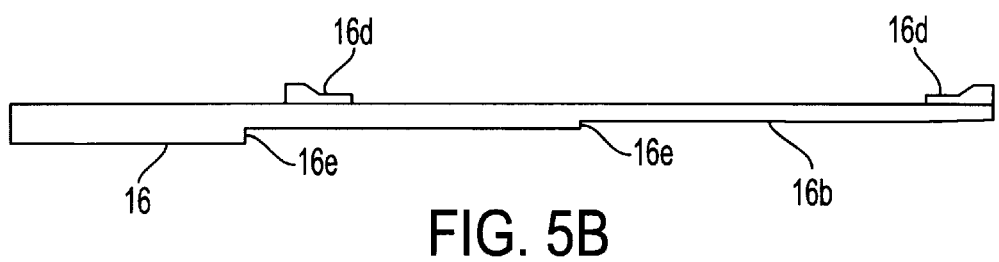
Figure 5C:
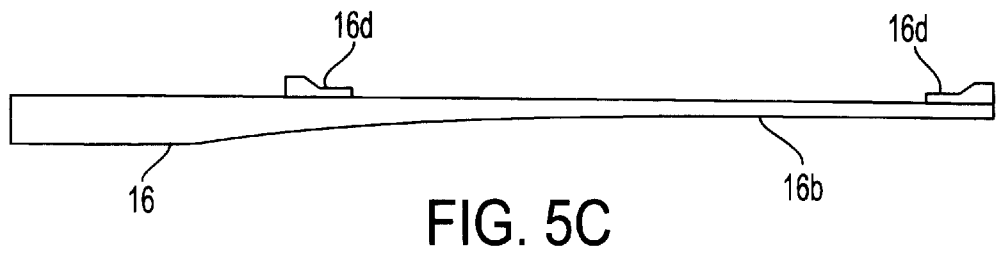

As shown in FIG. 4, the substrate receiver 16 has a base portion 16*a* attached to the carrying arm 14, two pawl portions 16*b*, 16*b* extending right and left from the base portion 16*a*, and a bridge portion 16*c* connecting the two pawl portions 16*b*, 16*b* with each other substantially at an intermediate portion of each pawl portion 16*b* in a longitudinal direction. Holding pins 16*d*, 16*d* for holding the substrate 18 are provided on each individual pawl portion 16*b*, in such a manner that the holding pins 16*d*, 16*d* are brought into contact with the peripheral portion of the substrate 18. The width of the head of each individual pawl portion 16*b* beyond the bridge portion 16*c* tapers down toward the head. Furthermore, as shown in FIG. 5(*a*), the upper surface of each pawl portion 16*b* is approximately horizontal, while the lower surface of each pawl portion 16*b*-1 is gradually inclined upward toward the head, so that the thickness of each individual pawl portion 16*b* is thinner toward the head thereof. By the above-mentioned construction, the rotational moment which is applied on each pawl portion 16*b* from the dead load of each pawl portion 16*b* can be reduced. Consequently, bending of each pawl portion 16*b* can be minimized while the strength of the base portion 16*a* can be maintained. As for the thickness of each pawl portion 16*b*, in addition to the example shown in FIG. 5(*a*), FIG. 5(*b*) shows a second example in which more than two stairs 16*e*, 16*e* are formed on the lower surface of pawl portion 16*b* so that the thickness of pawl portion 16*b* is reduced in stages, and FIG. 5(*c*) shows a third example in which a curved surface is formed on the lower surface of pawl portion 16*b*.

Reinforcement of the pawl portions 16*b*, 16*b* is made by connecting a plurality of pawl portions 16*b*, 16*b* with each other via the bridge portion 16*c*. Accordingly, when a large load is applied on one pawl portion 16*b*, the load is transmitted to the other pawl portion 16*b*, so that any ill-balanced stress is relaxed. Accordingly, the substrate 18 is always maintained at an approximately horizontal condition, i.e., without being inclined. However, depending on the shape or size of the base portion 16*a*, the bridge portion 16*c* may be eliminated. Furthermore, the pawl portions 16*b*, 16*b* are formed symmetrically, Accordingly, since the distribution of load of the substrate receiver 16 itself is symmetric, even if the pawl portions 16*b*, 16*b* are slightly bent, the extent of bending of one pawl portion 16*b* is rendered approximately equal to that of the other pawl portion 16*b* so that the substrate 18 is prevented from being inclined right or left.

In the substrate carrying apparatus constructed as described above, when the substrate alignment mechanism 21 corrects the location of the substrate 18, the piston rods 22*a* of the air cylinders 22, 22 are contracted, so that both arms 25 move toward the substrate 18. The position of the substrate alignment mechanism 21 is determined so that a clearance (e.g., 0.1 to 0.5 mm) between the contact portion 28 and the substrate 18 exists when the substrate 18 is properly located and the piston rods 22*a* of the air cylinders 20 are fully contracted. That is, the clearance becomes a tolerance for locating the substrate 18. If the location of the substrate 18 is out of the tolerance, the contact portion 28 contacts the substrate 18 and corrects its position so as to be within the tolerance. Since the contact portions 28 correspond to both opposite corners 18a, 18b of the substrate 18, the substrate 18 is located properly in both the X-axis direction and the Y-axis direction. When the substrate alignment mechanism 21 acts on the substrate 18, the substrate 18 can be held in place even if the rotary shaft 12 is rotated at a high speed.

When the piston rods 22a of the air cylinders 22, 22 are extended, the contact portions 28 leave the corners 18a, 18b and the substrate 18 is released from the contact portions 28 shown by a double dashed imaginary line in FIG. 2.

As described, since the clearance which defines the tolerance in locating the substrate is provided, the substrate 18 is prevented from being too biased to one side, even if the driving speeds of the air cylinder 22, 22 differ from each other. Additionally, the contacting area of the contact portions 28 with the substrate 18 can be minimized.

Figure 10:
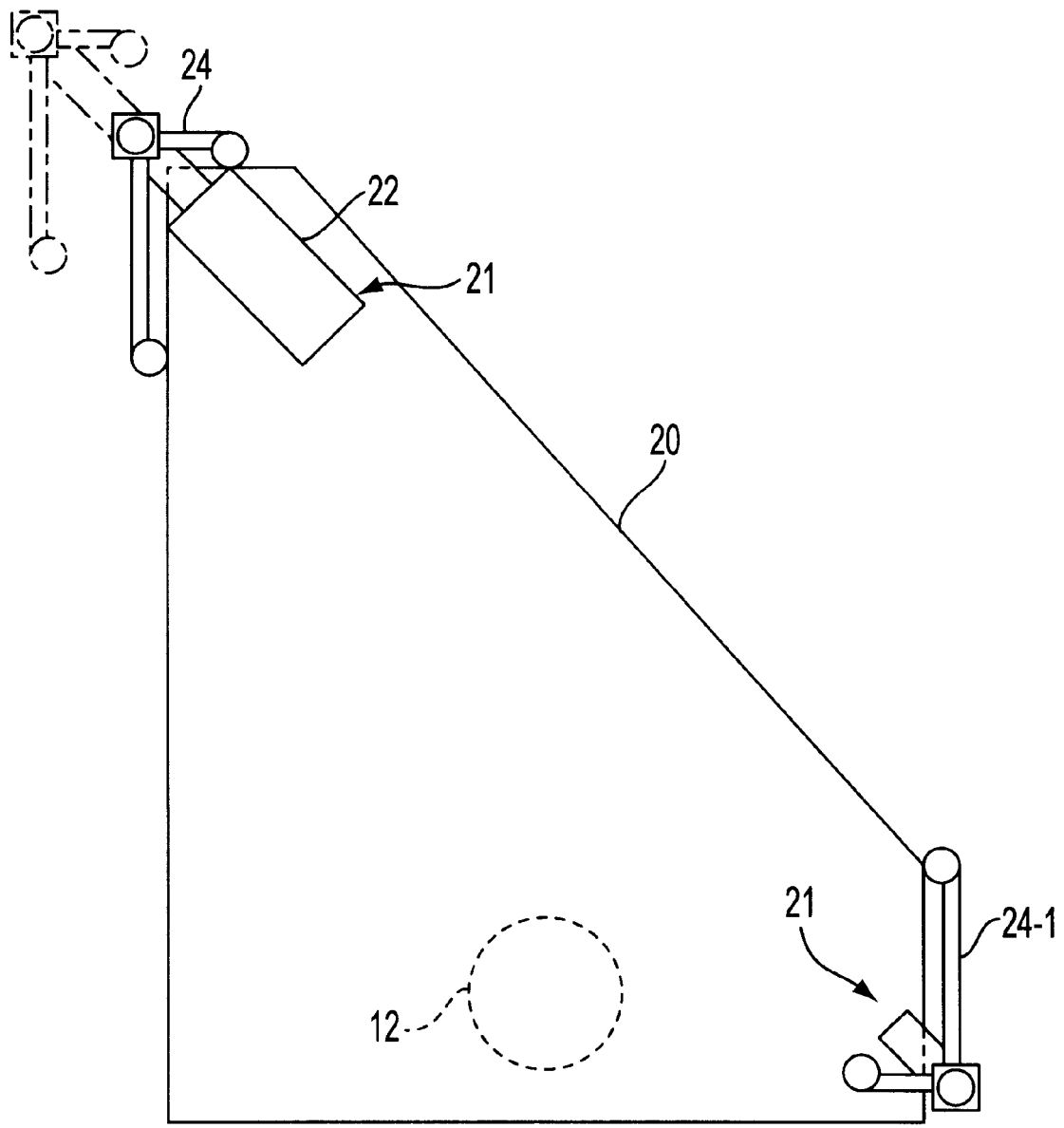
FIG. 10 is a plan view corresponding to FIG. 2 of a second embodiment of a substrate carrying apparatus according to the present invention.

FIG. 10 is a plan view corresponding to FIG. 2 of a second embodiment according to the present invention.

The substrate alignment mechanism 21 is attached to the rotary shaft 12 via a guide base 20 in the second embodiment, and includes a pair of location correcting members 24, 24-1. A first location correcting member 24-1 is fixed to the guide base 20, while a second location correcting member 24 is coupled to a single air cylinder 22. This pair of location correcting members 24, 24-1 is disposed on a diagonal line of a rectangular substrate 18 to be placed on the substrate receiver 16 with the substrate 18 therebetween, corresponding to the diagonally opposed corners 18a, 18b of the rectangular substrate 18.

In the second embodiment, the second location correcting member 24 is the same as the first location correcting member 24 of FIG. 2, in that it is movable by driving of air cylinder 22. However, the first location correcting member 24 differs from the location correcting member 24 of FIG. 2 in that it is not movable. Both location correcting members 24, 24-1 of the second embodiment in FIG. 10, however, operate in a similar manner to those of FIG. 2 in that they hold opposite corners 18a, 18b of substrate 18.

Figure 11A:
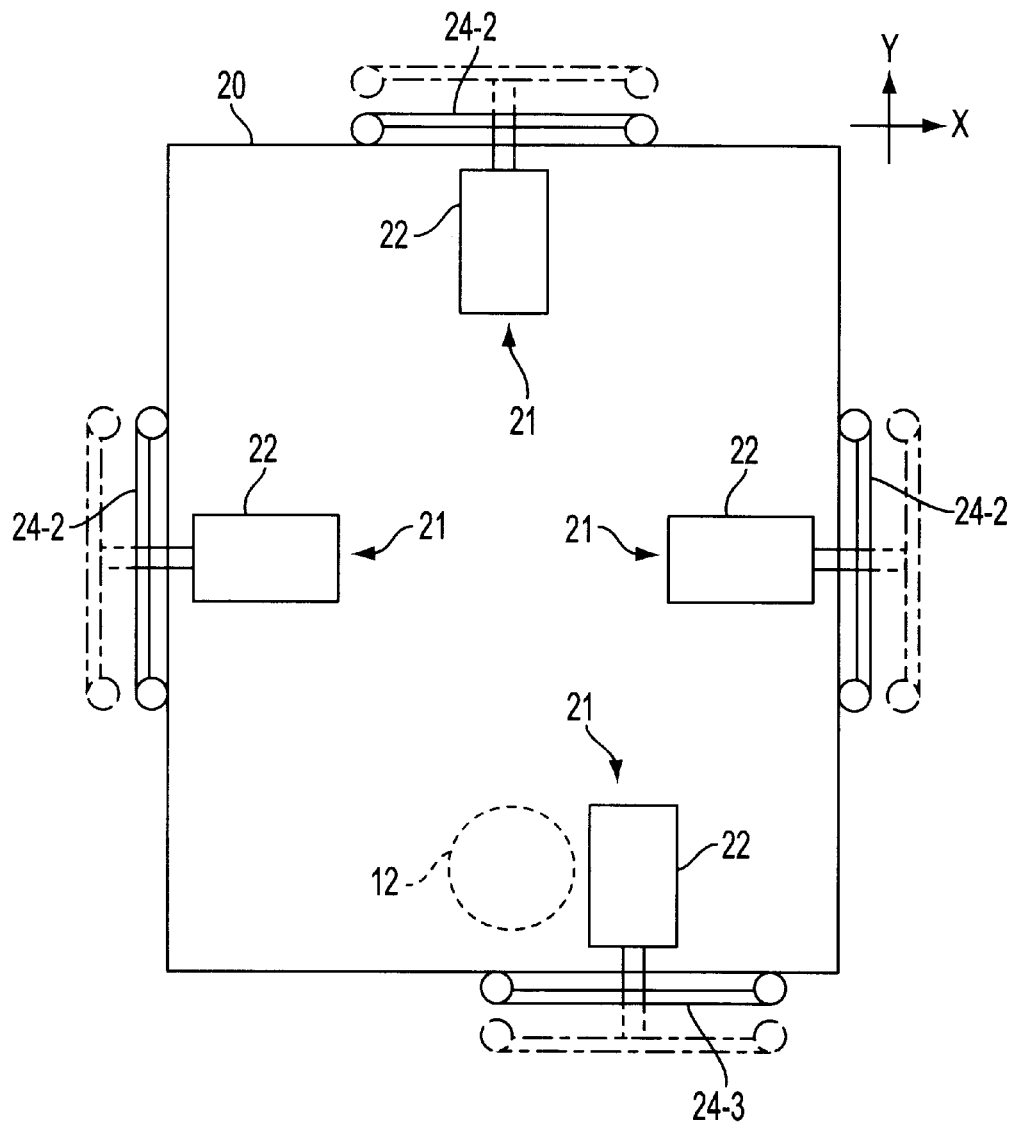
FIG. 11 is a plan view corresponding to FIG. 2 of a third embodiment of a substrate carrying apparatus according to the present invention.
Figure 11B:
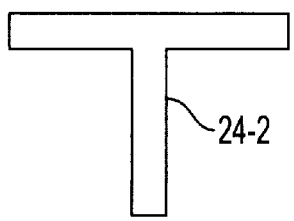
Figure 11C:
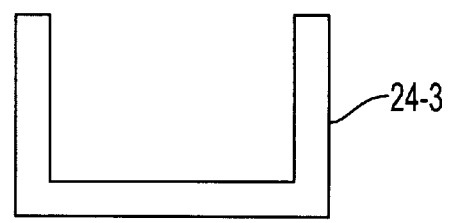

FIG. 11 is a plan view (corresponding to FIG. 2) of a third embodiment according to the present invention.

The substrate alignment mechanism 21 as attached to the rotary shaft 12 via the guide base 20 according to the third embodiment, includes two pairs of location correcting members 24-2, 24-2; 24-2, 24-3, which are coupled to respective air cylinders 22. One pair of location correcting member 24-2, 24-2 is disposed in the X-axis direction with substrate 18 therebetween, and the other pair of location correcting members 24-2, 24-3 is disposed in the Y-axis direction with substrate 18 therebetween. Each location correcting member 24-2 for the X-axis has a substantially T-shaped arm (see FIG. 11(b)), while the location correcting member 24-3 has a substantially U-shaped arm (see FIG. 11(c)) in order to avoid collision between the member 24-3 and the carrying arm.

In this third embodiment, the two pairs of location correcting members align the substrate in the X-axis direction and in the Y-axis direction, respectively. Although more than two location correcting members are provided, the loads of all the location correcting members are applied on the rotary shaft 12 via the guide base 20 and do not affect the carrying arm 14. In order to counteract the possibility that the location correcting members 24-3 collide with carrying arm 14 when carrying arm 14 extends, an ascending and descending mechanism may be additionally provided to move the carrying arm 14 vertically. Before the carrying arm 14 is extended, the carrying arm 14 is moved upwardly to a location where it can avoid collisions with the location correcting member 24-3.

Figure 12:
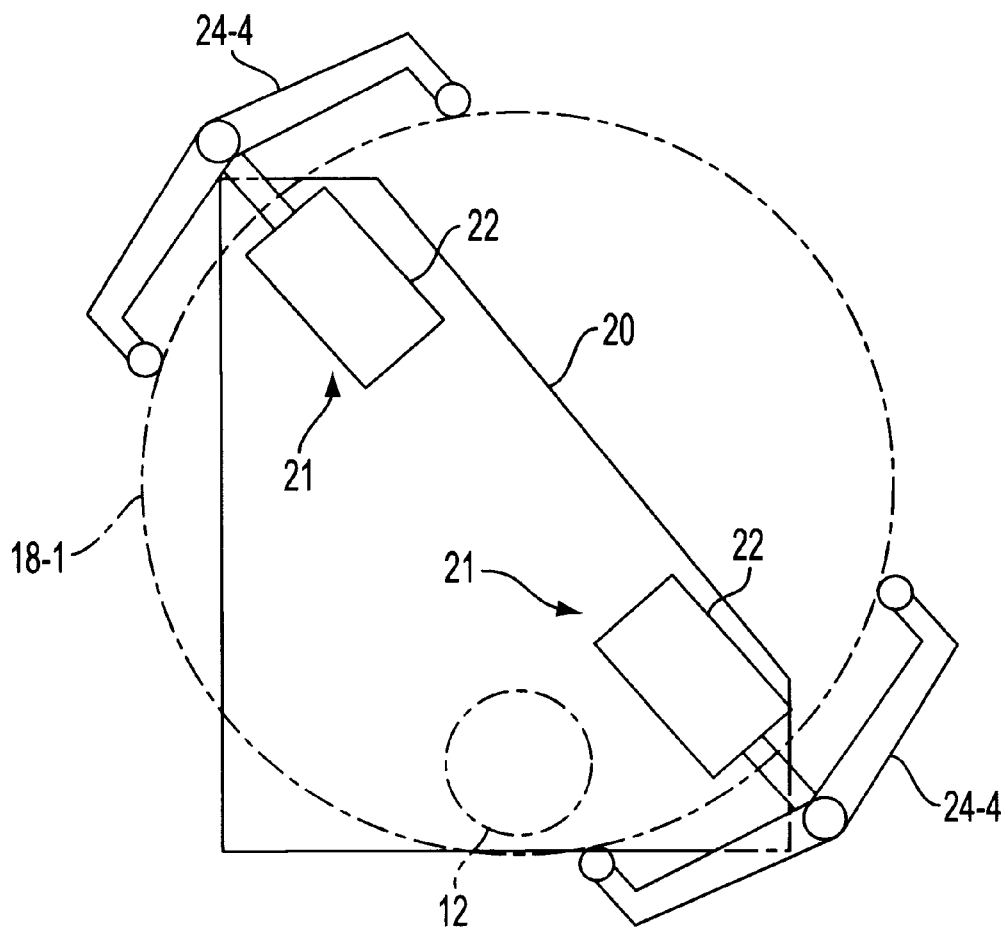
FIG. 12 is a plan view corresponding to FIG. 2 of a fourth embodiment of a substrate carrying apparatus according to the present invention.

FIG. 12 is a plan view (corresponding to FIG. 2) of a fourth embodiment according to the present invention.

The substrate alignment mechanism 21 attached to the rotary shaft 12 via the guide base 20 according to the fourth embodiment includes a pair of location correcting members 24-4, 24-4. This pair of location correcting members 24-4, 24-4 are disposed on a diameter of a circular substrate 18-1 to be placed on the substrate receiver 16, with the circular substrate 18-1 therebetween. Each location correcting member 24-4 has at least two contacting portions which can be brought into contact with the substrate 18-1. This fourth embodiment applied to the circular substrate 18 in a similar manner to the case of the rectangular substrate 18. If more than two location correcting members are provided, they are preferably disposed at equal intervals about a circumferential direction.

Figure 6:
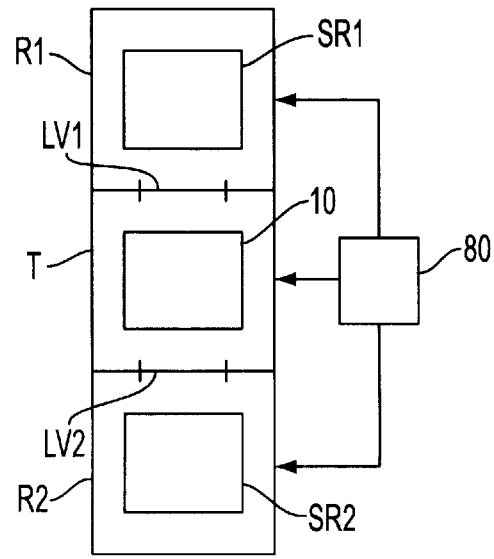
FIG. 6 is a layout drawing of an example of semiconductor manufacturing apparatus in which the substrate carrying apparatus of the present invention is used.

FIG. 6 is a layout drawing of an example of semiconductor manufacturing apparatus in which the substrate carrying apparatus of the present invention is used.

The substrate carrying apparatus of the present invention is applied for carrying processed substrates 18 in a vacuum from procession room R1 to procession room R2 as shown in FIG. 6. The substrate carrying apparatus of the present invention is installed in a transporting room T.

Figure 7:
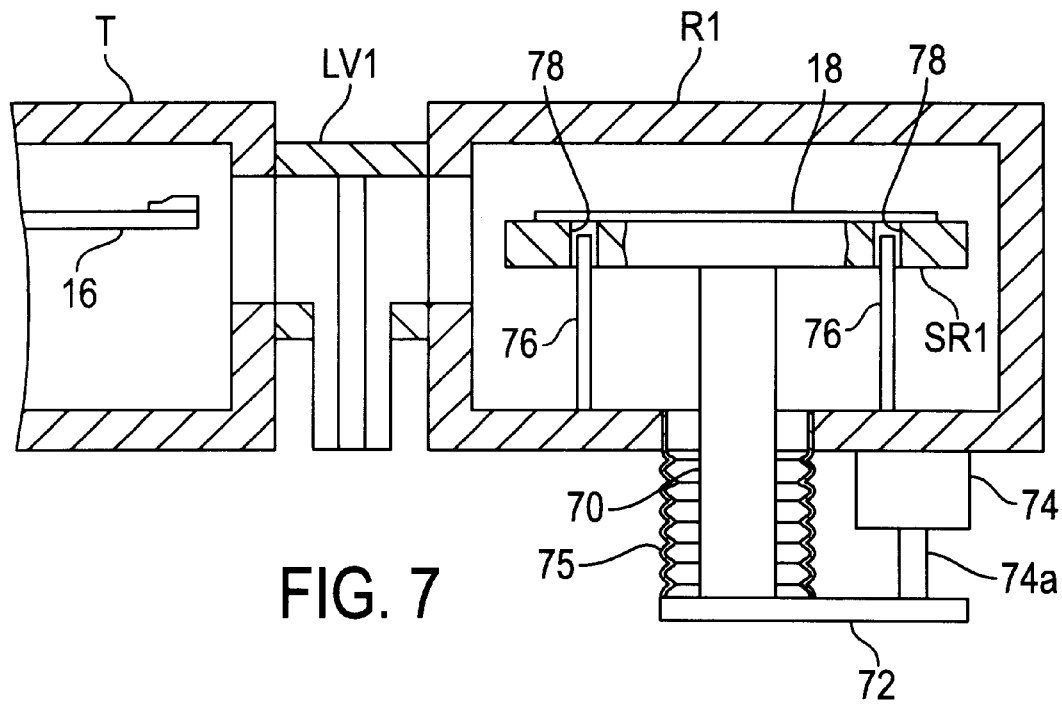
FIG. 7 is a sectional view of the processing room R1 of FIG. 6 in which a susceptor is ascending.

FIG. 7 is a sectional view of the processing room R1 of FIG. 1, in which a susceptor SR1 is ascending. The susceptor SR1 on which the processed substrates 18 are put is mounted in the processing room R1 so as to be able to ascend and descend. The susceptor SR1 is supported by a shaft 70, the bottom end of which is connected with a connecting plate 72. The connecting plate 72 is in turn connected with one end of a movable piston rod 74a of a cylinder 74 which is attached securely to the procession room R1 so that the susceptor SR1 ascends and descends together with vertical movement of the connecting plate 72 by means of the motion of the cylinder 74. A bellows 75 secures a vacuum in the processing room R1. The bellows 75 connects the processing room R1 with the connecting plate 72 and is able to extend and contract. Further, inside the processing room R1, a plurality of fixing pins 76 are inserted into through holes 78 which are provided in the susceptor SR1.

The processing room R2 has the same construction as the processing room R1.

Figure 8:
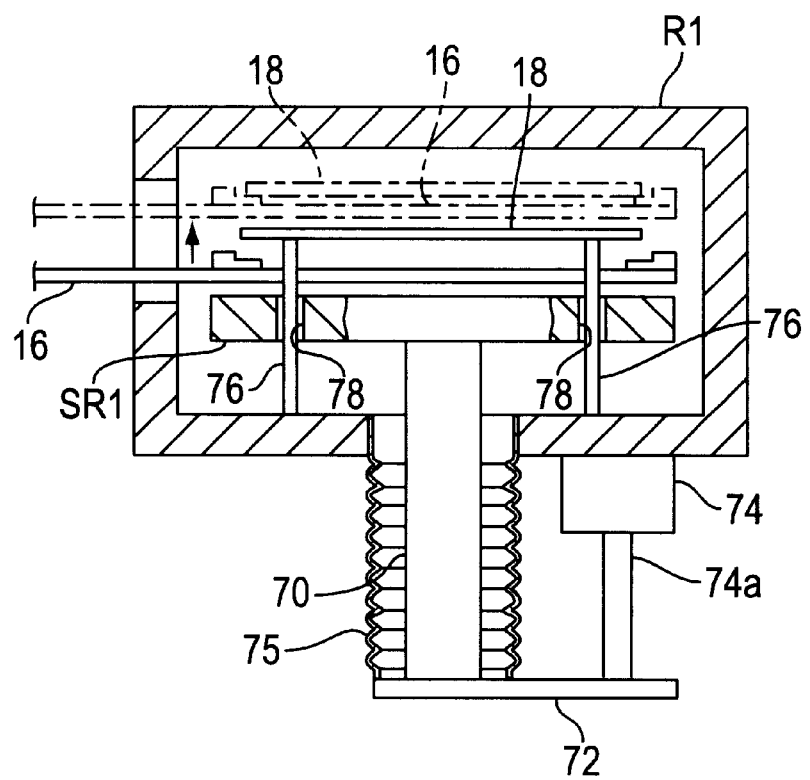
FIG. 8 is a sectional view of the processing room R1 of FIG. 6 in which a susceptor is descending.
Figure 9:
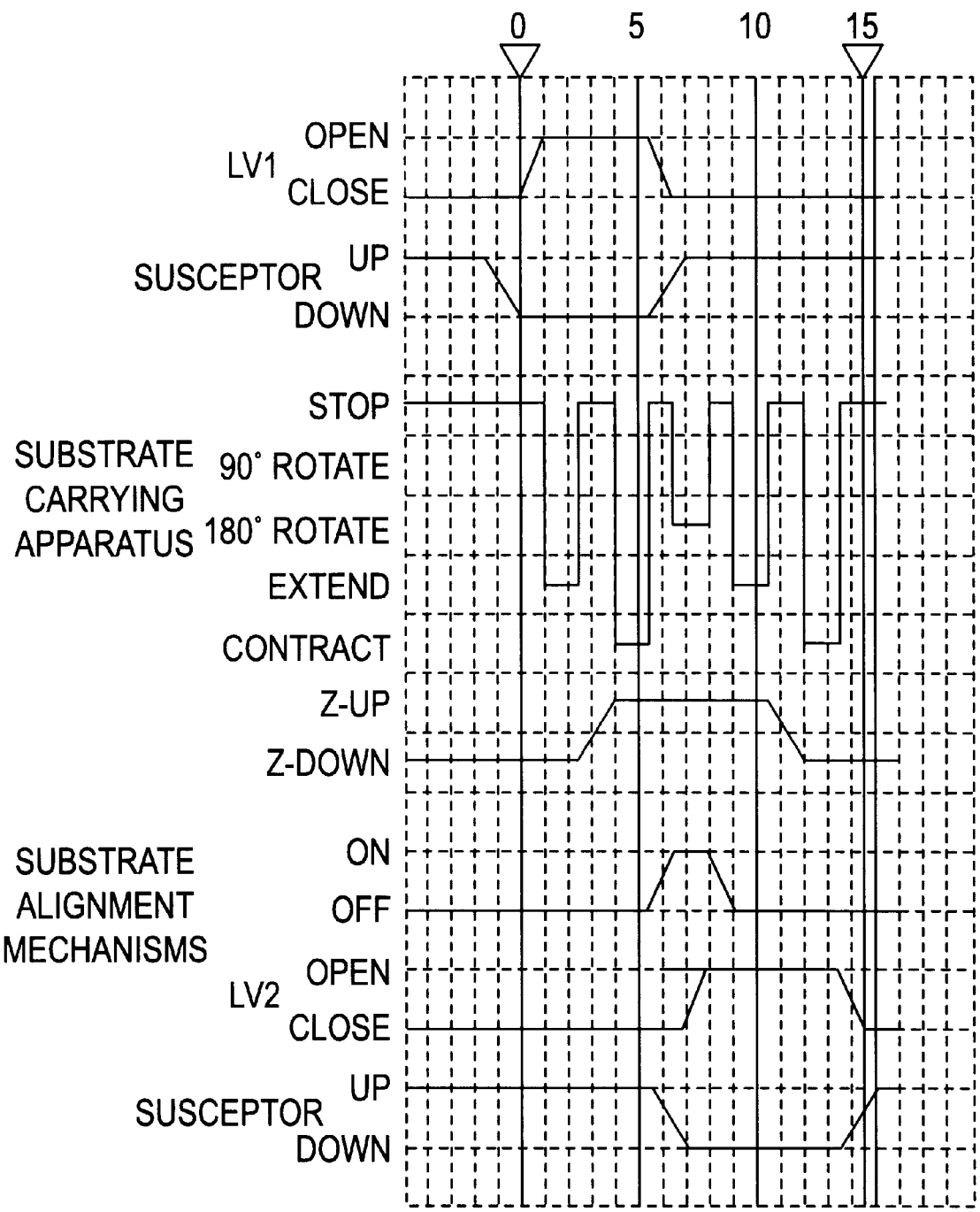
FIG. 9 is a time chart of operations of the semiconductor manufacturing apparatus of FIG. 6.

Referring to Figs.7 through 9, the procedure for carrying processed substrate 18 from processing room R1 to processing room R2 is explained. The following consecutive operations are controlled by controller 80 (see FIG. 6).

First, the piston rod 74a of the cylinder 74 is extruded, so that the connecting plate 72 is moved downward and the susceptor SR1 of processing room R1 descends (t=0 in FIG. 9). Thereby, as shown in FIG. 8, the fixing pins 76 protrude from the through-holes 78 of susceptor SR1 so that the top ends of the fixing pins supports the processed substrate 18. At this time, the substrate carrying apparatus 10 has been stopped, and the substrate alignment mechanism 24 is in a state of inactivity. A gate valve LV2 of processing room R2 has been shut, and the susceptor SR2 in the processing room R2 has ascended.

A gate valve LV1 of the processing room R1 is then opened, and the piston rods 22a of the air cylinders 22 are extruded, so that the arm 25 is kept away from the substrate 18. In this state, the carrying arm 14 is extended, as shown in FIG. 8, so that the substrate receiver 16 is moved under the substrate 18, between a plurality of fixing arms 76. Then, the carrying arm 14 and substrate receiver 16 are moved upward by the driving motor 32 (for vertical movement of the rotary shaft and the carrying arm) so that the processed substrate 18 is received by the substrate receiver 16 (this state is shown with imaginary line in FIG. 8). Thereafter, the motor 46 for rotation of the arm is driven, so that the carrying arm 14 is contracted. Then, the gate valve LV1 of the processing room R1 is shut. Thereafter, the susceptor SR1 in processing room R1 ascends, while the susceptor SR2 of processing room R2 descends (t=7 in FIG. 9).

Then, the piston rods 22a of the air cylinders 22 are withdrawn, the arm 25 is driven, and the alignment of processed substrate 18 is made by the contact portion 28. Then, while alignment of the processed substrate 18 is preserved, the motor 44 for rotating the rotary shaft is driven so that the rotary shaft 12 is turned 180 degrees, by which the substrate 18 is directed toward the processing room R2, and then the gate valve LV2 of the processing room R2 is opened (t=8 in FIG. 9). Thereafter, the piston rods 22a of air cylinders 22 are extruded, so that the arm 25 is kept away from the substrate 18. After the processed substrate 18 is released, the processed substrate 18 is carried by the carrying arm 14 as it extends. In the processing room R2, the procedure in the processing room R1 is reversed, the substrate receiver 16 descends, and the substrate 18 is supported by the fixing pins 76. Thereafter, the carrying arm 14 is contracted. Then, the gate valve LV2 of the processing room R2 is shut, susceptor SR2 ascends so that the substrate 18 is put on the susceptor SR2 (t=15 in FIG. 9).

In the above-mentioned rotary action of the substrate carrying apparatus 10 during carrying of the substrate, since the processing substrate 18 is held by the contact portions 28 of the substrate alignment mechanism 24 (even if the rotary shaft 12 is rotated at high speed), a shift of the substrate from the proper location does not occur. Accordingly, the transport of the substrate is reliable. Since the load of the substrate alignment 24 is applied on the guide base 20, the load is not applied on the carrying arm 14.

Particularly, when processing rooms and carrier rooms as shown in FIG. 6 are arranged in an alternating manner, and the processed substrate is carried into one processing room by means of one substrate carrying apparatus in a carrier room and carried out of the carrier room by another substrate carrying apparatus, shifting of the substrate from the proper location increases if substrate alignment mechanisms are not used. However, in the present invention, since each individual substrate carrying apparatus is provided with a substrate alignment mechanism so that shifting of the substrate from the proper location (during rotation of substrate carrying apparatus) is suppressed, the accuracy in carrying of substrate is improved so that the substrate can be always located at a given place in a processing room.

Furthermore, collisions and/or dropping of the substrate from the carrying arm inside a processing room, and collisions when the substrate is packed into a cassette or other holder (due to increase in shifting of the substrate from the proper location) can be prevented.

Still further, the state of heating of individual substrates and the state of gas flow can be held constant. The accuracy in processing of substrates can be improved by improving the uniformity of the process between individual substrates.

What is claimed is:

1. A substrate carrying apparatus for caring a substrate, comprising:

a frame;

a rotary shaft supported by the frame so as to be rotatable and vertically movable relative to the frame;

a guide base supported by said rotary shaft and rotatable together with said rotary shaft:

an extendable carrying arm pivoted to the rotary shaft;

a substrate receiver attached to an end of the extendable carrying arm capable of receiving the substrate; and a substrate alignment mechanism for locating and aligning the substrate on the substrate receiver, said substrate alignment mechanism being attached to the rotary shaft via said guide base and rotatable together with said guide base and said rotary shaft, said extendable carrying arm moving said substrate receiver toward and away from said guide base and said substrate alignment mechanism, so that the substrate located and aligned on said substrate receiver is carried toward and away from said substrate alignment mechanism.

2. The substrate carrying apparatus as claimed in claim 1, wherein the substrate alignment mechanism includes at least one pair of location correcting members opposing each other, with the substrate therebetween, said pair of locating correcting members being coupled to a driving mechanism, and each of said locating correction members being displaceable by the driving mechanism to be brought into contact with the substrate.

3. The substrate carrying apparatus as claimed in claim 2, wherein the substrate carried by the substrate carrying apparatus is a rectangular substrate, and wherein the location correcting members are disposed on a diagonal line of the rectangular substrate.

4. The substrate carrying apparatus as claimed in claim 3, wherein each of said location correcting members can be brought into contact with adjacent sides of the substrate carried by the substrate carrying apparatus at corresponding corners of the rectangular substrate.

5. The substrate carrying apparatus as claimed in claim 2, wherein each of said location correcting members comprises a contact portion which comprises a circular profile from a plan view.

6. The substrate carrying apparatus as claimed in claim 2, wherein each of said location correcting members comprises a contact portion which has an elliptical profile from a plan view.

7. The substrate carrying apparatus as claimed in claim 1, wherein the substrate alignment mechanism includes at least one pair of location correcting members opposing each other, with the substrate carried by the substrate carrying apparatus therebetween, a first one of said pair of location correcting members being fixed to the guide base and a second one of said pair of location correcting members being coupled to a driving mechanism, said second one of said pair of location correcting members being displaceable by the driving mechanism so that each of said location correction members can be brought into contact with the substrate.

8. The substrate carrying apparatus as claimed in claim 7, wherein the substrate carried by the substrate carrying apparatus is a rectangular substrate, and wherein the location correcting members are disposed on a diagonal line of the rectangular substrate.

9. The substrate carrying apparatus as claimed in claim 8, wherein each of said location correcting members can be brought into contact with adjacent sides of the substrate carried by the substrate carrying apparatus at corresponding corners of the rectangular substrate.

10. The substrate carrying apparatus as claimed in claim 7, wherein each of said location correcting members comprises a contact portion which has a circular profile from a plan view.

11. The substrate carrying apparatus as claimed in claim 7, wherein each of said location correcting members comprises a contact portion which has an elliptical profile from a plan view.

12. The substrate carrying apparatus as claimed in claim 1, wherein the substrate receiver has a base portion attached to the carrying arm and a plurality of pawl portions which diverge from the base portion, each of said plurality of pawl portions having a length extending to a head and a width tapering along said length toward said head.

13. The substrate carrying apparatus as claimed in claim 12, each of said plurality of pawl portions further having a thickness which becomes thinner along said length toward said head.

14. The substrate carrying apparatus as claimed in claim 12, wherein the substrate receiver comprises a bridge portion connecting the pawl portions with each other.

15. A substrate carrying apparatus for carrying a substrate, comprising:
  a frame;
  a rotary shaft supported by the frame so as to be rotatable and vertically movable relative to the frame;
  an extendable carrying arm pivoted to the rotary shaft;
  a substrate receiver capable of receiving a substrate, said substrate receiver attached to an end of the extendable carrying arm;
  a guide base fixed to the rotary shaft in such a manner that the guide base is approximately parallel to the substrate receiver and below the substrate receiver, and rotates together with the rotary shaft;
  a driving mechanism supported by the guide base; and
  location correcting members extending above the substrate receiver and coupled to the driving mechanism, the location correcting members being displaceable by the driving mechanism to hold the substrate in place, said location correcting members being rotatable together with the guide base, said extendable carrying arm moving said substrate receiver toward and away from said guide base and said location correcting members, so that the substrate is carried by said substrate receiver toward and away from a position where said location correcting members hold the substrate in place.

16. The substrate carrying apparatus as claimed in claim 15, wherein the substrate carried by said substrate carrying apparatus is a rectangular substrate, and wherein the location correcting members are disposed on a diagonal line of the rectangular substrate.

17. The substrate carrying apparatus as claimed in claim 16, wherein each of said location correcting members can be brought into contact with adjacent sides of the substrate carried by said substrate carrying apparatus at corresponding corners of the rectangular substrate.

18. The substrate carrying apparatus as claimed in claim 15, wherein each of said location correcting members comprises a contact portion which has a circular profile from a plan view.

19. The substrate carrying apparatus as claimed in claim 15, wherein each of said location correcting members comprises a contact portion which has an elliptical profile from a plan view.

20. The substrate carrying apparatus as claimed in claim 15, wherein the substrate receiver has a base portion attached to the carrying arm and a plurality of pawl portions which diverge from the base portion, each of said plurality of pawl portions having a length extending to a head and a width tapering along said length toward said head.

21. The substrate carrying device as claimed in claim 20, each of said plurality of pawl portions further having a thickness which becomes thinner along said length toward said head.

22. The substrate carrying apparatus as claimed in claim 20, wherein the substrate receiver comprises a bridge portion connecting the pawl portions with each other.

* * * * *

UNITED STATES PATENT AND TRADEMARK OFFICE
CERTIFICATE OF CORRECTION

PATENT NO. : 5,957,651
DATED : September 28, 1999
INVENTOR(S) : Y. TAKEBAYASHI et al.

It is certified that error appears in the above-identified patent and that said Letters Patent is hereby corrected as shown below:

At column 10, line 2 (claim 1, line 1) of the printed patent, "caring" should be ---carrying---.

At column 12, line 34 (claim 21, line 1) of the printed patent, "device" should be ---apparatus---.

Signed and Sealed this

Twenty-first Day of November, 2000

Attest:

Q. TODD DICKINSON

*Attesting Officer*   *Director of Patents and Trademarks*